United States Patent
Bayan et al.

(10) Patent No.: US 7,491,625 B2
(45) Date of Patent: Feb. 17, 2009

(54) GANG FLIPPING FOR IC PACKAGING

(75) Inventors: Jaime A. Bayan, Palo Alto, CA (US); Nghia Tu, San Jose, CA (US); Anindya Poddar, Sunnyvale, CA (US); Ashok Prabhu, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 80 days.

(21) Appl. No.: 11/691,431

(22) Filed: Mar. 26, 2007

(65) Prior Publication Data

US 2008/0241993 A1 Oct. 2, 2008

(51) Int. Cl.
*H01L 21/00* (2006.01)

(52) U.S. Cl. .................... 438/460; 438/464; 438/113; 257/E21.602; 257/E21.705

(58) Field of Classification Search .......... 438/460, 438/464, 113; 257/787, 782, 783, 679
See application file for complete search history.

(56) References Cited

U.S. PATENT DOCUMENTS

| | | | |
|---|---|---|---|
| 6,060,769 A | 5/2000 | Wark | |
| 6,175,162 B1 * | 1/2001 | Kao et al. | 257/787 |
| 6,378,758 B1 | 4/2002 | Haba | |
| 6,482,680 B1 | 11/2002 | Khor et al. | |
| 6,507,120 B2 | 1/2003 | Lo et al. | |
| 6,577,012 B1 | 6/2003 | Greenwood et al. | |
| 6,580,165 B1 | 6/2003 | Singh | |
| 6,593,545 B1 * | 7/2003 | Greenwood et al. | 219/121.85 |
| 6,661,087 B2 | 12/2003 | Wu | |
| 6,700,187 B2 | 3/2004 | Paek | |
| 6,828,220 B2 | 12/2004 | Pendse et al. | |
| 6,846,704 B2 | 1/2005 | Paek | |
| 6,858,919 B2 | 2/2005 | Seo et al. | |
| 6,873,032 B1 | 3/2005 | McCann et al. | |
| 6,943,434 B2 | 9/2005 | Tangpuz et al. | |
| 6,953,711 B2 | 10/2005 | Khor et al. | |
| 6,953,988 B2 | 10/2005 | Seo et al. | |
| 7,135,385 B1 * | 11/2006 | Patwardhan et al. | 438/464 |
| 2006/0049528 A1 * | 3/2006 | Kang et al. | 257/777 |

* cited by examiner

*Primary Examiner*—Walter L Lindsay, Jr.
*Assistant Examiner*—Abdulfattah Mustapha
(74) *Attorney, Agent, or Firm*—Beyer Law Group LLP

(57) ABSTRACT

A method of handling an IC wafer that includes a multiplicity of dice is described. Solder bumps are formed on bond pads on the active surface of the wafer. The back surface of the bumped wafer is adhered to a first mount tape. The wafer is singulated while it is still secured to the first tape to provide a multiplicity of individual dice. The active surfaces of the singulated dice are then adhered to a second tape with the first tape still adhered to the back surfaces of the dice. The first tape may then be removed. In this manner, the back surfaces of the dice may be left exposed and facing upwards with the active surfaces of the dice adhered to the second tape. The described method permits the use of a conventional die attach machine that is not designated for use as a flip-chip die attach machine.

13 Claims, 2 Drawing Sheets

GANG FLIPPING FOR IC PACKAGING

BRIEF DESCRIPTION OF THE INVENTION

The present invention relates generally to the packaging of integrated circuits (ICs). More particularly, a method for use in handling IC dice is described.

BACKGROUND OF THE INVENTION

There are a number of conventional processes for attaching integrated circuit (IC) dice to a printed circuit board (PCB). Often the dice are packaged into a plastic or ceramic package. Such packages often utilize metallic lead frames. The lead frame generally includes a plurality of leads that are electrically connected to associated bond pads on the die. The lead frame also generally includes associated metallic contacts for electrically connecting the package to contacts on the PCB. Alternatively, the bond pads on the die itself may be directly connected to contacts on the PCB.

One type of die is known as a flip-chip die. A flip-chip die generally has solder bumps formed on the bond pads on the active surface of the die. After singulation from a wafer, the die is generally flipped over prior to attachment to a suitable substrate. Suitable substrates include lead frames, ball grid arrays (BGAs) and PCBs, among others.

While existing flip-chip packaging methods and systems work well, there are continuing efforts to develop even more efficient methods and systems for packaging solder bumped dice.

SUMMARY OF THE INVENTION

In one embodiment, a method of handling an integrated circuit wafer that includes a multiplicity of integrated circuit dice is described. Each integrated circuit die includes an active surface and a back surface. A multiplicity of bond pads are formed on the active surface. In the described method, the back surface of the wafer is mounted and adhered to a first releasable mount tape. Solder bumps are formed on the bond pads to form a bumped wafer. In one embodiment, the solder bumps are formed on the bond pads before the first releasable tape has been adhered to the back surface of the wafer.

The wafer is singulated while the wafer is still secured to the first releasable mount tape to provide a multiplicity of individual bumped dice. It should be noted that the singulation does not cut fully through the first releasable mount tape. In this way, the back surfaces of the singulated dice remain adhered to the first releasable mount tape. The bumped active surfaces of the singulated dice are then adhered to a second tape with the first releasable mount tape still adhered to the back surfaces of the singulated dice. The first releasable mount tape may then be released and removed from the back surfaces of the dice. In this manner, the back surfaces of the dice may be left exposed and facing upwards with the bumped active surfaces of the dice adhered to the second tape.

In some embodiments, the individual dice are picked up from the second tape, aligned, and attached to a suitable substrate. By way of example, bond pads on the dice may be attached and electrically connected to the leads of a lead frame panel by means of the solder bumps. In a preferred embodiment, a conventional die attach machine that is not designated for use as a flip-chip die attach machine is used to pick-up, align and position the dice onto the desired substrate.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE DRAWINGS

The present invention relates generally to the packaging of integrated circuits (ICs). More particularly, a method for use in handling IC dice is described.

In the following description, numerous specific details are set forth to provide a thorough understanding of the present invention. It will be apparent, however, to one skilled in the art that the present invention may be practiced without some or all of these specific details. In other instances, well known process steps have not been described in detail in order to avoid unnecessary obscuring of the present invention.

The following description focuses on the packaging of flip-chip style dice utilizing lead frames. However, it is contemplated that the present invention may be advantageously practiced in the packaging of a variety of solder bumped dice into a variety of package configurations in which solder bumps on the dice are to be directly electrically connected with metallic contacts on a substrate.

Various embodiments of the present invention will be described with reference to FIGS. 1-2. Aspects of the present invention provide a method for packaging solder bumped dice using conventional die attach machines. More particularly, a method is described for singulating and preparing solder bumped dice for attachment to suitable substrates using a die attach machine that is not configured for use as a flip-chip die attach machine.

Flip-chip die attach machines, in general, are considerably more expensive than conventional (non-flip-chip) die attach machines. By way of example, flip-chip die attach machines may presently cost upwards of approximately $500,000 compared with roughly $150,000-$200,000 for conventional die attach machines. Furthermore, conventional die attach machines are significantly faster than flip-chip machines. By way of example, a conventional die attach machine may presently attach upwards of 10,000-15,000 dice per hour. Conversely, flip-chip die attach machines may be capable of attaching fewer than 4,000 dice per hour. Flip-chip die attach machines do offer advantages, however, such as the ability to process high pin count devices. However, these high pin count capabilities are not required for many applications. More particularly, many applications, such as those employing micro surface-mount devices (SMDs), require very low pin counts. It is thus desirable to adapt the packaging process such that high speed conventional die attach machines may be used to pick up and position dice onto substrates.

Figure 1:
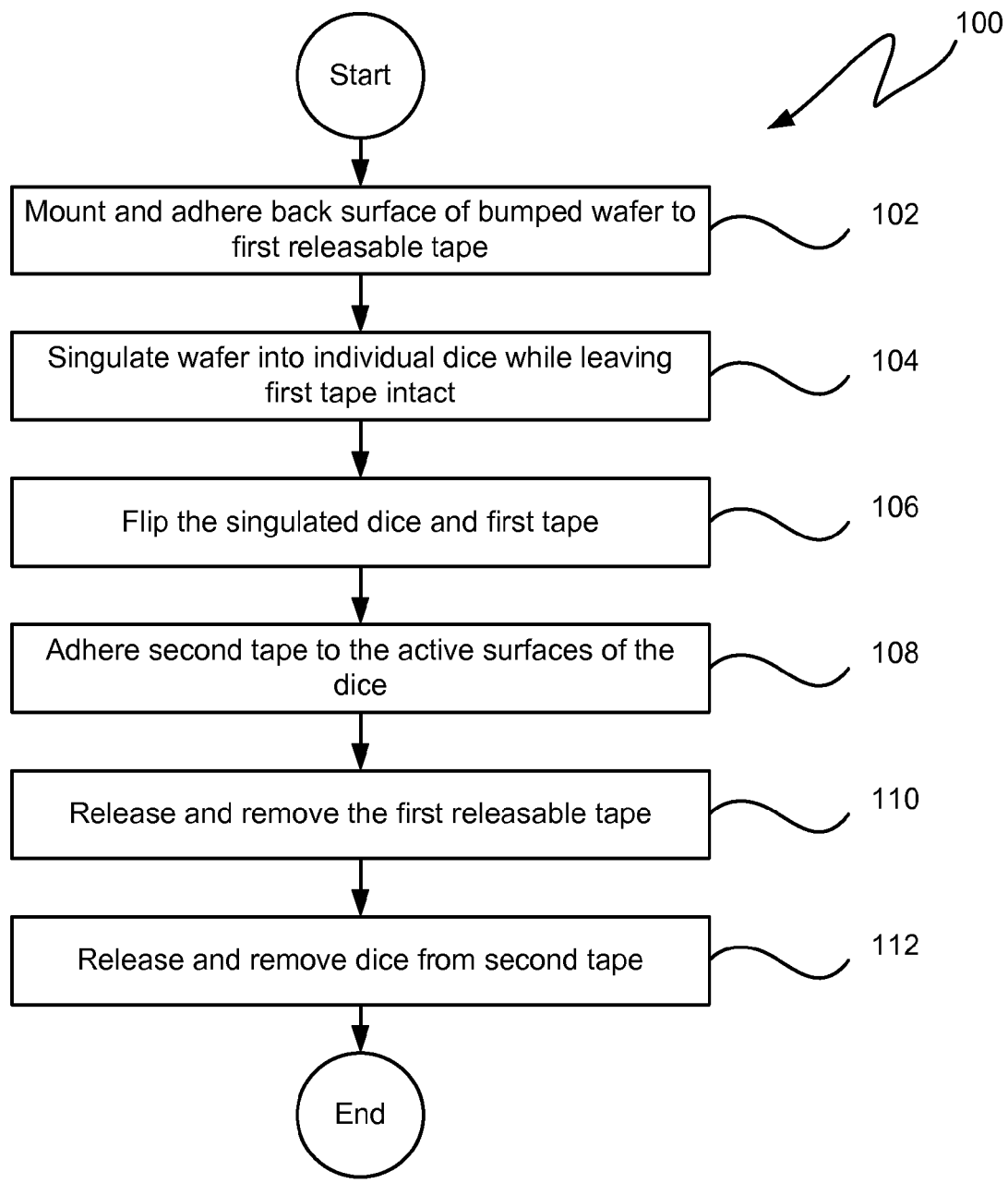
FIG. 1 is a flow chart illustrating a process for singulating and attaching flip-chip dice in accordance with an embodiment of the present invention.

Referring initially to FIG. 1, and further in view of FIGS. 2A-2E, a process 100 of singulating and handling integrated circuit dice in accordance with one embodiment of the present invention will be described. A semiconductor wafer 202 that includes a large number of dice is provided. In one embodiment, each die is configured for use as a micro SMD. Micro SMDs may be attached directly to PCBs or, alternatively, may be packaged prior to attachment to a PCB. In various other embodiments, each die may be configured for use in a flip-chip-on-lead (FCOL) package or one of many other styles of packages including ball grid array (BGA) packages and land grid array (LGA) packages, among others.

Figure 2A:
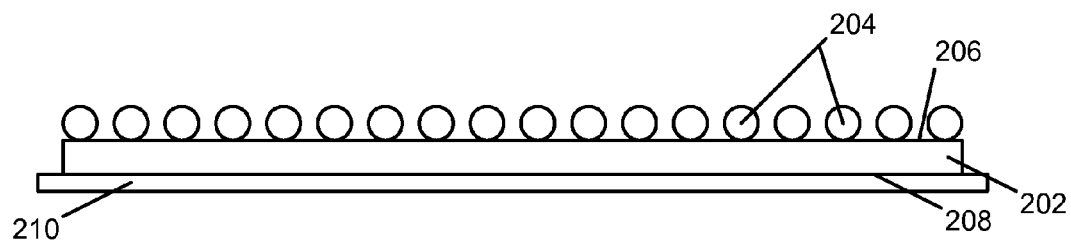
FIGS. 2A-2E illustrate various stages in the process of FIG. 1.

At 102 the back surface 208 of the wafer 202 is mounted and adhered to a wafer mount tape 210 as illustrated in FIG. 2A. In a preferred embodiment, the wafer mount tape 210 is a releasable tape. By way of example, the releasable mount tape 210 may be an ultraviolet (UV) releasable tape that loses its adherence when exposed to UV light. In one embodiment, the wafer 202 is bumped prior to mounting and adhering the wafer to the wafer mount tape 210. Solder bumps 204 may be formed directly on I/O pads on the active surface 206 of the die or on other bond pads that have been redistributed from the I/O pads using conventional redistribution techniques. Additionally, underbump metallization stacks (UBMs) may be formed on the bond pads of the die prior to solder bumping. Generally, the solder bumps 204 are intended to be mounted and attached directly to contact pads of a substrate, such as a lead frame or printed circuit board (PCB).

Figure 2B:
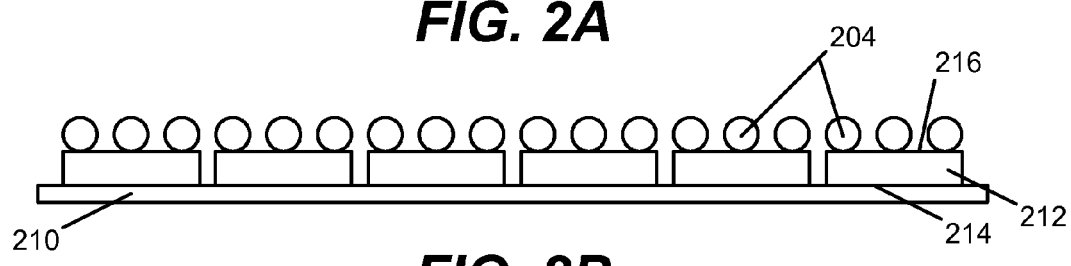

At 104 the wafer 202 is singulated yielding a large number of individual solder bumped dice 212 as illustrated in FIG. 2B. Although the cross-section illustrated in FIG. 2B shows the wafer 202 being singulated into only six dice 212, it should be appreciated that the number of dice formed in the wafer may be significantly higher. By way of example, wafer 202 may include many thousands of solder bumped dice 212. In one embodiment, the wafer 202 is singulated by a wafer saw such as a gang-cutting saw. It should be noted that the tape 210 is not sawed fully through or otherwise singulated during the singulation of the dice 212. It is anticipated that portions of the tape 210 may be cut, however, it is preferable that none of the cuts proceed all of the way through the tape so that the tape remains intact after singulation. It should also be noted that the back surfaces 214 of the dice 212 remain adhered to the tape 210.

Figure 2C:
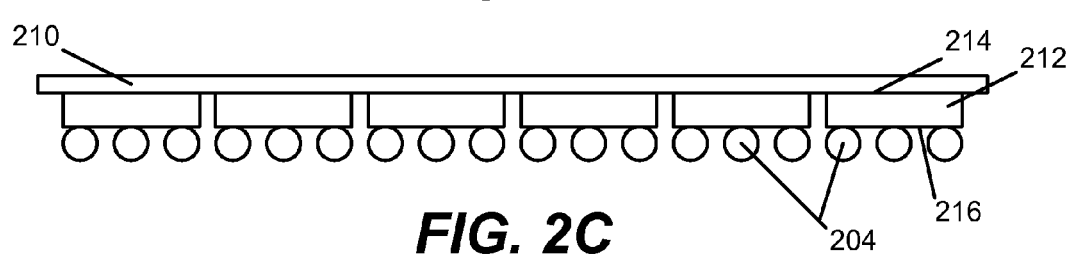
Figure 2D:
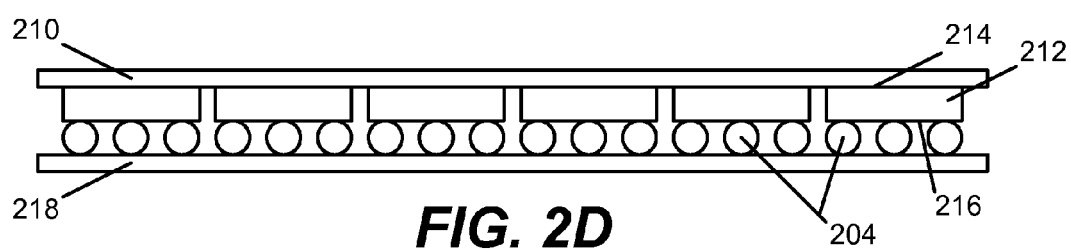

The entire singulated wafer and tape 210 may then be flipped entirely over at 106 such that the active surfaces 216 of the dice 212 are facing downwards, as illustrated in FIG. 2C. The wafer may be flipped with any suitable means. Subsequently, as illustrated in FIG. 2D, the active surfaces 216 of the dice 212 are then mounted and adhered to a second tape 218 at 108. In one embodiment, the second tape 218 is also a UV releasable tape or other releasable tape. It is known in the art that UV releasable tapes generally provide better adhesion than other conventional wafer mount tapes. This may be advantageous given that the tape 218 generally contacts only a small proportion of the total surface area on the active surfaces 216 of the dice 212. More specifically, in one embodiment, the tape 218 only contacts the solder bumps 204.

In an alternate embodiment, the second tape 218 may be adhered to the active surfaces 216 of the dice 212 prior to flipping the dice. Subsequently, the first tape 210, dice 212 and second tape 218 may all be flipped at once. This embodiment may provide greater stability to the singulated dice 212 during the flipping process. More specifically, bending of the tape and singulated wafer may be reduced. In turn, this may reduce the likelihood that the dice 212 are de-attached from the first tape or even damaged due to contact with other dice during the flipping process. In particular, if the tape and singulated wafer are allowed to bend too much during flipping, the dice 212 may be chipped, cracked or otherwise damaged due to inter-dice contact.

Figure 2E:
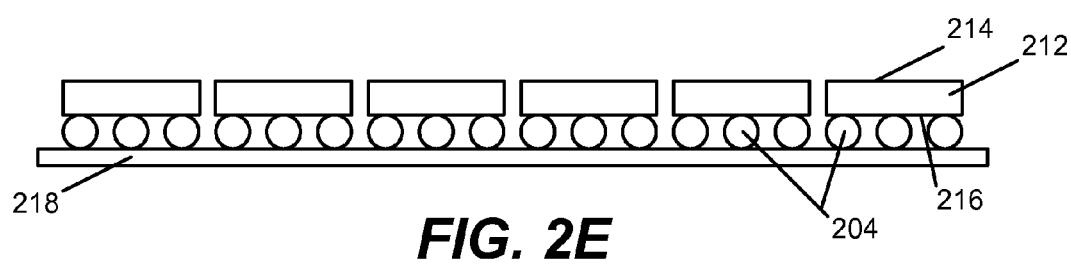

The first releasable mount tape 210 is then released and removed at 110 as illustrated in FIG. 2E. By way of example, if the first releasable mount tape 210 is a UV releasable mount tape then the tape may be released by exposing the tape to UV radiation. The described method thus allows the dice 214 to be singulated and flipped without changing position relative to one another. More particularly, the method just described allows for flipping the matrix of dice 212 of the singulated wafer without losing die registration.

The individual dice 212 may then be released and removed from the second tape 218 at 112. Subsequently, the dice 212 may be taped and reeled or otherwise stored. In an alternate embodiment, the dice 212 may be sent for attachment to a substrate. It should be particularly noted that the orientation of the dice 212 allows for the use of a conventional die attach machine to pick up the dice and position the dice onto a desired substrate. More particularly, since the back surfaces 214 of the dice 212 are facing upwards rather than downwards, a flip-chip die attach machine is not required. Flip-chip die attach machines are generally characterized by a flipping feature in which the flip-chip die is picked up and then flipped prior to die attach. In the method described above the dice 212 have already been flipped altogether as a whole.

During die attach, each die 212 is preferably picked up by a conventional die attach machine. Generally, either the solder bumps 204 or the contacts on the substrate to which the die 212 is to be attached are then prepared with flux. In one embodiment, the die 212 may be dipped in a reservoir of flux to apply flux to the solder bumps 204. In another embodiment, the contacts on the substrate are prepared with flux. Subsequently, the die is aligned and positioned on the substrate.

In one embodiment, the substrate may be a lead frame. In other embodiments, the dice may be attached to other substrates. By way of example, in flip-chip-on-board (FCOB) applications, the dice may be flip-chip attached directly to a printed circuit board (PCB). In micro SMD technology, the dice may be directly attached to PCBs as well as to lead frames. Additionally, in various embodiments, additional solder paste may be applied to the contacts on the substrate prior to die attach. Generally, the die 212 and substrate are then placed in a reflow oven for reflow of the solder. Solder reflow generally completes the die attach process. The devices may then be encapsulated with a molding material and subsequently singulated.

Given certain allowances, it is expected that upwards of approximately 8,000 flip-chip dice per hour may be attached according to the described method using a conventional die attach machine.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. It will be apparent to one of ordinary skill in the art that many modifications and variations are possible in view of the above teachings.

The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A method of handling a bumped integrated circuit wafer that has a multiplicity of integrated circuit dice formed therein, each integrated circuit die including an active surface and a back surface, the active surface having a multiplicity of bond pads, the bond pads having solder pads thereon, the method comprising:

adhering a back surface of the bumped wafer to a first releasable mount tape;

singulating the wafer with the wafer secured to the first releasable mount tape to provide a multiplicity of individual bumped dice, wherein the singulation does not cut fully through the first releasable mount tape and wherein the back surfaces of the singulated dice remain adhered to the first releasable mount tape;

adhering the bumped active surfaces of the singulated dice to a second tape with the first releasable mount tape still adhered to the back surfaces of the dice; and releasing the first releasable mount tape and removing the released mount tape from the back surfaces of the dice after adhering the bumped active surfaces of the singulated dice to the second tape thereby leaving the back surfaces of the dice exposed and facing upwards with the bumped active surfaces of the dice adhered to the second tape.

2. A method as recited in claim 1, further comprising flipping the singulated dice over as a whole after singulation and prior to adhering the singulated dice to the second tape.

3. A method as recited in claim 1, further comprising picking up an individual die from the second tape, aligning the die and attaching the individual die to a suitable substrate.

4. A method as recited in claim 3, wherein the picking up, aligning and attaching are accomplished using a die attach machine that is not designated for use as a flip-chip die attach machine and wherein the die attach machine does not flip the die.

5. A method as recited in claim 3, further comprising applying flux to contacts on the substrate prior to attaching the die to the substrate.

6. A method as recited in claim 3, further comprising applying flux to solder bumps on the active surface of the die prior to attaching the die to the substrate.

7. A method as recited in claim 3, further comprising encapsulating portions of the die and substrate with a molding material.

8. A method as recited in claim 1, wherein the first releasable mount tape is a UV releasable tape, the method further comprising releasing the first releasable mount tape by exposure to UV light after adhering the bumped active surfaces of the singulated dice to the second tape.

9. A method as recited in claim 1, wherein the second tape is a UV releasable tape, the method further comprising releasing the second tape by exposure to UV light after the first tape has been removed.

10. A method as recited in claim 1, wherein each die is configured for use as a micro surface-mount device.

11. A method as recited in claim 3, wherein the substrate is a lead frame.

12. A method as recited in claim 3, wherein the substrate is a printed circuit board.

13. A method as recited in claim 1, further comprising removing the dice from the second tape and taping and reeling the dice.

* * * * *